(12) United States Patent
Ichiki

(10) Patent No.: US 11,259,421 B2
(45) Date of Patent: Feb. 22, 2022

(54) ELECTRONIC DEVICE

(71) Applicant: KYOCERA Corporation, Kyoto (JP)

(72) Inventor: Shintaro Ichiki, Yokohama (JP)

(73) Assignee: KYOCERA Corporation, Kyoto (JP)

(*) Notice: Subject to any disclaimer, the term of this patent is extended or adjusted under 35 U.S.C. 154(b) by 0 days.

(21) Appl. No.: 16/878,104

(22) Filed: May 19, 2020

(65) Prior Publication Data
US 2020/0383216 A1 Dec. 3, 2020

(30) Foreign Application Priority Data
May 29, 2019 (JP) .............................. JP2019-100717

(51) Int. Cl.
H05K 7/02 (2006.01)
H05K 7/04 (2006.01)
H05K 5/00 (2006.01)
H01Q 1/24 (2006.01)
H05K 5/02 (2006.01)
H05K 7/20 (2006.01)

(52) U.S. Cl.
CPC ........... *H05K 5/0017* (2013.01); *H01Q 1/243* (2013.01); *H05K 5/0247* (2013.01); *H05K 7/20954* (2013.01)

(58) Field of Classification Search
USPC ......................................... 361/809, 810, 807
See application file for complete search history.

(56) References Cited

U.S. PATENT DOCUMENTS

| 6,243,592 | B1* | 6/2001 | Nakada | H01Q 1/243 |
|---|---|---|---|---|
| | | | | 455/575.7 |
| 2014/0078679 | A1* | 3/2014 | Tsunoda | H05K 7/20445 |
| | | | | 361/720 |
| 2015/0005043 | A1 | 1/2015 | Shiraishi | |
| 2015/0241935 | A1* | 8/2015 | Jang | G06F 1/1626 |
| | | | | 361/679.54 |
| 2018/0131087 | A1* | 5/2018 | Kim | H01Q 1/2283 |
| 2018/0299929 | A1* | 10/2018 | Kim | G06F 1/1658 |
| 2019/0363277 | A1* | 11/2019 | Kwak | H01L 51/5237 |
| 2019/0384358 | A1* | 12/2019 | Choe | H01Q 1/245 |

FOREIGN PATENT DOCUMENTS

| JP | 2014-60285 A | 4/2014 |
|---|---|---|
| JP | 2016-76811 A | 5/2016 |
| WO | 2013/108312 A1 | 7/2013 |

* cited by examiner

*Primary Examiner* — Hung S. Bui
(74) *Attorney, Agent, or Firm* — Procopio Cory Hargreaves and Savitch LLP

(57) ABSTRACT

An electronic device comprises a first case, a resin plate, and a display. The first case has a first surface and a second surface. The resin plate is located inside the first case. The display is located on a side facing the first surface of the first case.

12 Claims, 7 Drawing Sheets

ELECTRONIC DEVICE

CROSS REFERENCE TO RELATED APPLICATION

This application claims priority to and the benefit of Japanese Patent Application No. 2019-100717 filed on May 29, 2019, the entire disclosure of which is incorporated herein by reference.

TECHNICAL FIELD

The present disclosure relates to an electronic device that performs wireless communication.

BACKGROUND

An electronic device having a frame in which a metal plate is insert molded is known, for example as described in JP 2016-76811 A.

SUMMARY

An electronic device according to an embodiment of the present disclosure comprises a first case, a resin plate, and a display. The first case has a first surface and a second surface located on an opposite side from the first surface. The resin plate is located inside the first case. The display is located on a side facing the first surface.

DETAILED DESCRIPTION

Improvement in the convenience of electronic devices is needed. It would be helpful to provide a convenient electronic device. According to an embodiment of the present disclosure, a convenient electronic device can be provided.

Figure 1:
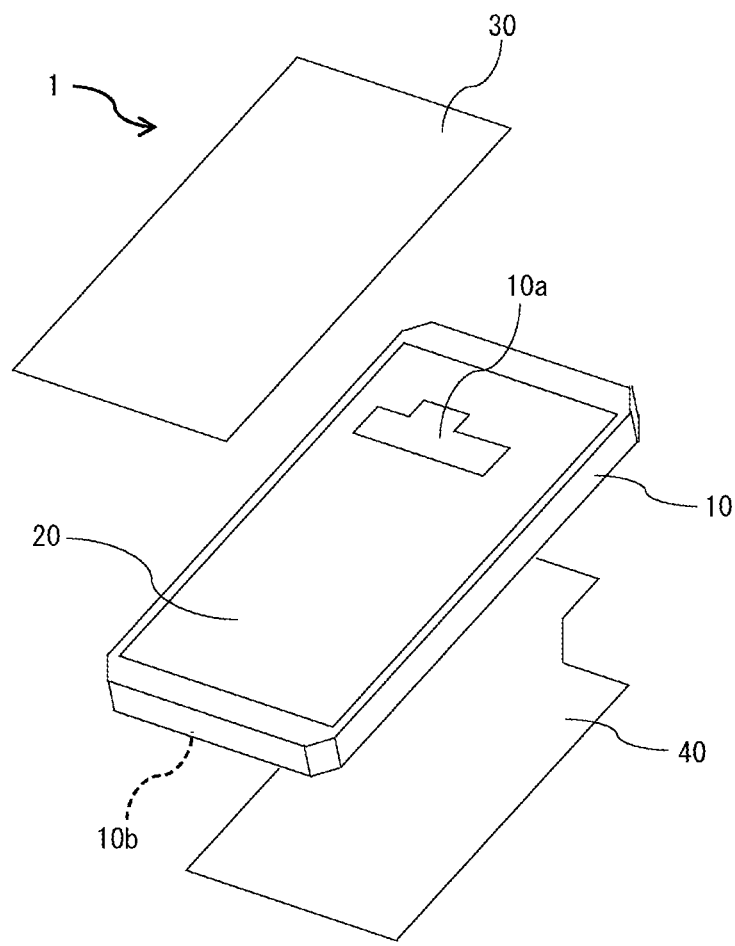
FIG. 1 is an exploded perspective view illustrating an example of a structure of an electronic device according to an embodiment.

As illustrated in FIG. 1, an electronic device 1 according to an embodiment includes a first case 10, a resin plate 20, and a display 30. The electronic device 1 may further include a circuit board 40.

The first case 10 has a first surface 10a facing the positive direction of the Z-axis, and a second surface 10b facing the negative direction of the Z-axis. The second surface 10b is located on the opposite side from the first surface 10a. The resin plate 20 is located inside the first case 10. A structure that combines the first case 10 and the resin plate 20 is also referred to as a housing. The housing has a platy shape that is approximately rectangular as seen from the Z-axis direction. The shape of the housing is not limited to such, and may be any of other various shapes.

The resin plate 20 has a platy shape. For example, the resin plate 20 may be made of a resin such as polyethylene terephthalate (PET) or polycarbonate (PC) as material. The material of the resin plate 20 is not limited to such, and may be any other resin.

The display 30 is located on the positive side of the Z-axis with respect to the first case 10 or the resin plate 20. That is, the display 30 is located on the side facing the first surface 10a of the first case 10 (i.e. the first surface 10a side). The circuit board 40 is located on the negative side of the Z-axis with respect to the first case 10 or the resin plate 20. That is, the circuit board 40 is located on the side facing the second surface 10b of the first case 10 (i.e. the second surface 10b side). The circuit board 40 is located closer to the second surface 10b than the resin plate 20, inside the first case 10. The display 30 may include a display device such as a liquid crystal display (LCD), an organic electroluminescence (EL) display, or an inorganic EL display.

The circuit board 40 has a platy shape. The circuit board 40 may have any other shape. The circuit board 40 may be made of a resin, ceramics, or the like as material. The circuit board 40 may have various components mounted thereon. Examples of the components mounted on the circuit board 40 include a communication module, a processor, a memory, etc. The circuit board 40 may have terminals, wires, and the like mounted thereon.

The communication module can achieve various functions such as wireless communication. The communication module may be electrically connected to a communication antenna 24 (see FIG. 7) to perform wireless communication with an external device.

The processor may execute various functions of the electronic device 1. The processor may function as a communication module. The processor may be implemented as a single integrated circuit. The integrated circuit is abbreviated as an IC. The processor may be implemented as a plurality of integrated circuits and/or discrete circuits communicably connected to one another. The processor may be implemented based on other various known techniques.

The memory may include semiconductor memory, magnetic memory, or the like. The memory may store various information, programs executed by the communication module and/or the processor, and the like. The memory may function as working memory of the communication module and/or the processor.

Figure 2:
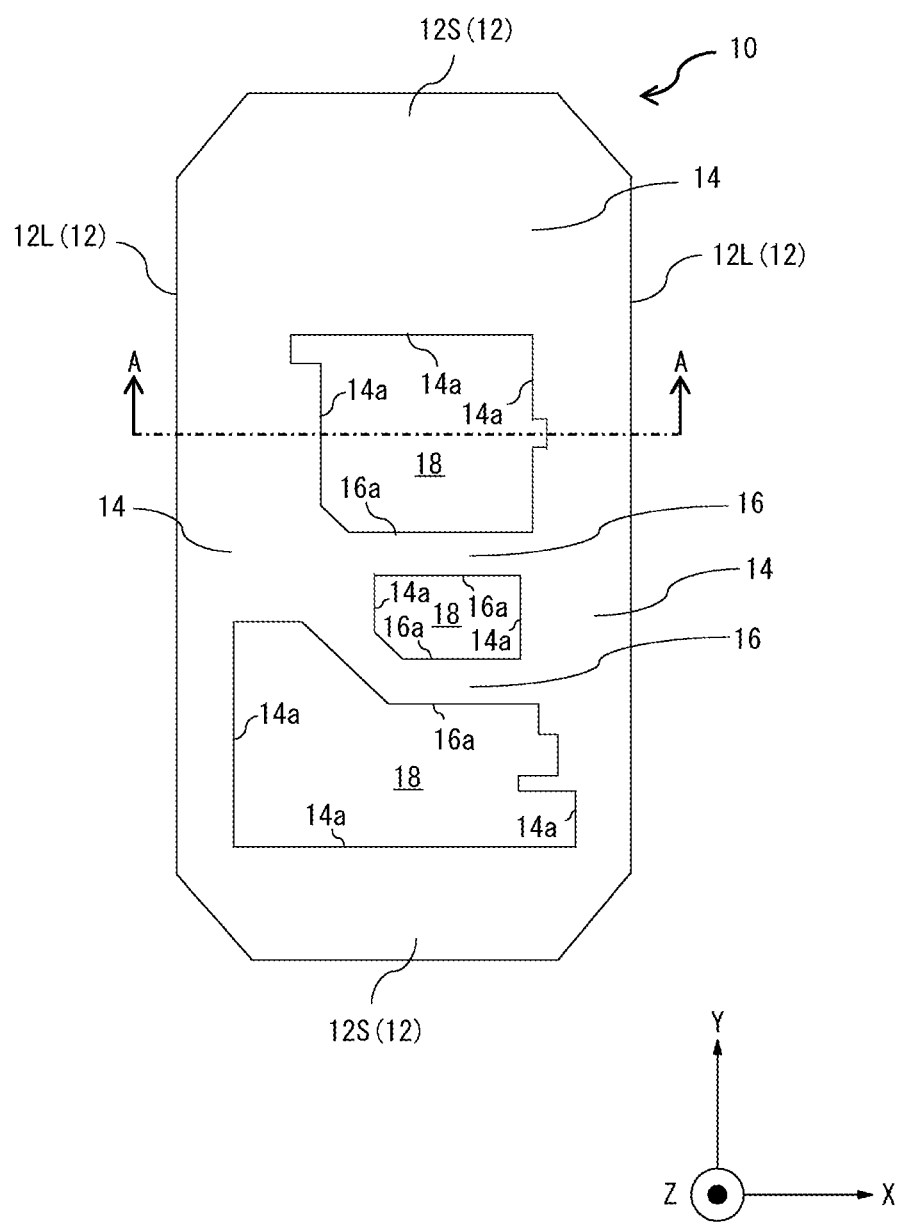
FIG. 2 is a plan view illustrating an example of a structure of a first case.
Figure 3:
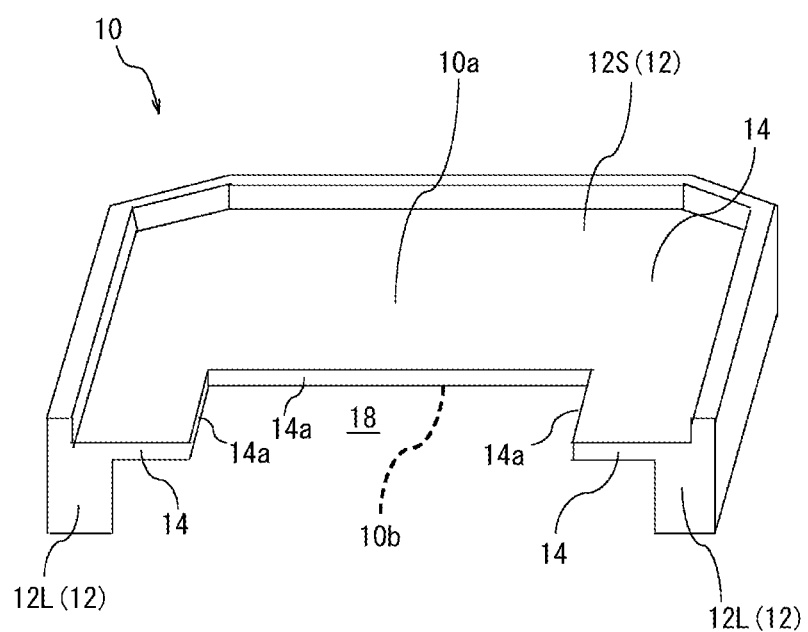
FIG. 3 is a perspective view including an A-A cross section in FIG. 2.

As illustrated in FIGS. 2 and 3, the first case 10 has a frame portion 12. The frame portion 12 forms the outer periphery of the first case 10. The shape of the outer periphery formed by the frame portion 12 is not limited to an approximately rectangular shape as illustrated in the drawings, and may be any of other various shapes. In this embodiment, the frame portion 12 has two opposing long sides 12L and two opposing short sides 12S. It is assumed that the long sides 12L extend along the Y-axis, and the short sides 12S extend along the X-axis.

The first case 10 also has a support portion 14 projecting inward from the frame portion 12. The support portion 14 has, for example, a platy shape. The support portion 14 supports the resin plate 20 on the first surface 10a side of the first case 10. The support portion 14 may support the resin plate 20 on the second surface 10b side. The resin plate 20 is adhered to the support portion 14 by an adhesion member 22 (see FIG. 6). The resin plate 20 may be fixed to the support portion 14 not by adhesion but by any of other various methods.

The support portion 14 has side surfaces 14a at its ends of projection from the frame portion 12. The side surfaces 14a define an opening 18 through the first case 10 from the first surface 10a side to the second surface 10b side. In other words, the side surfaces 14a are the edges of the opening 18. The shape of the opening 18 in a plan view of the first case 10 may be approximately rectangular. The shape of the opening 18 is not limited to such, and may be any of other various shapes.

The first case 10 may further have a bridging portion 16 connecting the two opposing long sides 12L of the frame portion 12. The bridging portion 16 divides the opening 18 into at least two openings. The bridging portion 16 has side surfaces 16a. The openings 18 separated by the bridging portion 16 are defined by the side surfaces 14a of the support portion 14 and the side surfaces 16a of the bridging portion 16. That is, the side surfaces 14a and the side surfaces 16a are the edges of the openings 18. The openings 18 separated by the bridging portion 16 may be approximately rectangular in shape. The shapes of the openings 18 are not limited to such, and may be any of other various shapes.

The first case 10 may be formed by injection molding of a resin. For example, the first case 10 may be formed by injection molding of a composite material (glass fiber reinforced material of polyamide) of polyamide (PA) and glass fiber (GF). The first case 10 may be formed by injection molding of a resin of another type such as polycarbonate (PC) or a composite material of such a resin and GF. In the case where the first case 10 is formed by injection molding of a resin, there is a possibility that the frame portion 12 deforms as a result of contracting during cooling after injection molding. For example, the frame portion 12 tends to warp inward at the long sides 12L. As a result of the first case 10 including the bridging portion 16, the inward deformation of the frame portion 12 can be suppressed by the bridging portion 16. At least one of the openings 18 separated by the bridging portion 16 may be shorter in the direction along the long sides 12L than in the direction along the short sides 12S. In this case, the frame portion 12 is prevented from warping inward at the long sides 12L, as compared with the case where the opening 18 is longer in the direction along the long sides 12L than in the direction along the short sides 12S. Hence, the frame portion 12 is prevented from deformation.

The support portion 14 or the bridging portion 16 may be thinner than the frame portion 12. Thus, the rigidity of the first case 10 is enhanced by the frame portion 12. Moreover, the thinner support portion 14 or bridging portion 16 can increase the capacity in which components can be arranged in the electronic device 1.

Figure 4:
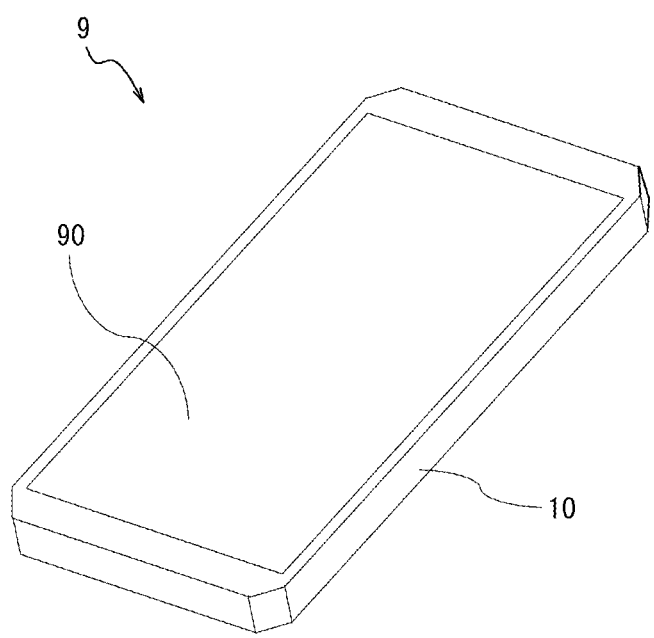
FIG. 4 is a perspective view illustrating an example of a structure of an electronic device according to a comparative example.
Figure 4:
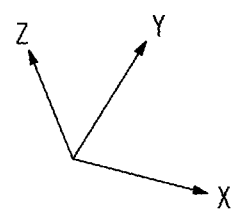

As described above, the electronic device 1 according to this embodiment includes the first case 10, and the resin plate 20 located inside the first case 10. This can enhance the rigidity of the housing. A comparative example is an electronic device 9 including a housing in which the first case 10 and a metal plate 90 are integrally molded, as illustrated in FIG. 4. In the electronic device 9 according to the comparative example, the first case 10 is formed by insert molding of the metal plate 90. The housing, as a result of including the metal plate 90, has high rigidity but increases in weight. The electronic device 1 according to this embodiment includes not the metal plate 90 but the resin plate 20, and therefore is more lightweight than the electronic device 9 according to the comparative example. The electronic device 1 according to this embodiment also has high rigidity, while being lightweight. The convenience of the electronic device 1 can thus be improved.

Figure 5:
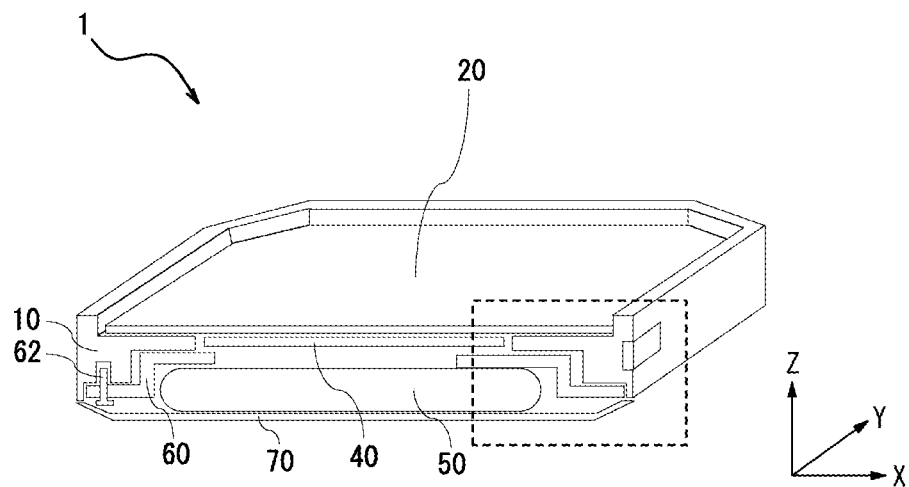
FIG. 5 is a perspective view including a cross section in the example of the structure of the electronic device.
Figure 6:
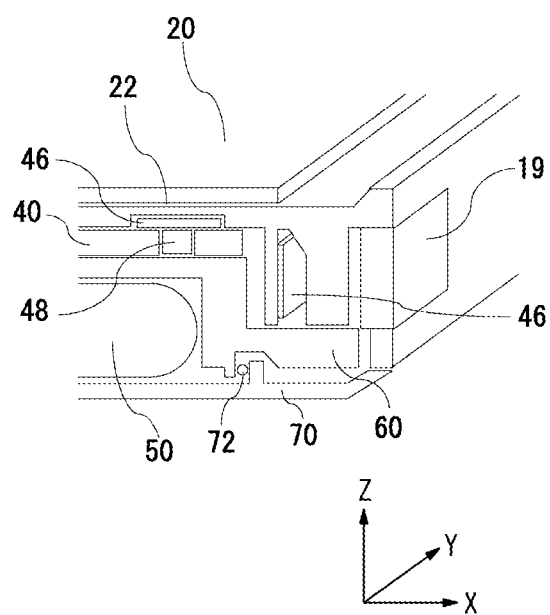
FIG. 6 is an enlarged view of a dashed line enclosed part in FIG. 5.

As illustrated in FIGS. 5 and 6, the electronic device 1 may further include a second case 60. The second case 60 may be, for example, formed using a composite material (glass fiber reinforced material of polycarbonate) of polycarbonate (PC) and glass fiber (GF). The second case 60 may be formed using a resin material of another type, or using any of other various materials. The second case 60 is fastened to the first case 10 by a fastening member 62. The fastening member 62 may include screws, bolts, etc. The second case 60 may be fastened removably. In the case where the second case 60 is removable, maintenance for the electronic device 1 is easy. The second case 60 may be adhered to the first case 10. In the case where the second case 60 is adhered to the first case 10, the bond strength can be maintained more easily than in the case where the second case 60 is fastened removably to the first case 10.

The electronic device 1 may further include a battery 50. The battery 50 may supply power to each component of the electronic device 1. The battery 50 may include a rechargeable secondary battery. Examples of the secondary battery include a lithium-ion battery, a nickel-cadmium battery, and a nickel-hydrogen battery. The battery 50 is not limited to a secondary battery, and may include an unrechargeable primary battery. Examples of the primary battery include an alkaline battery and a manganese battery. The battery 50 may be contained in the second case 60.

The electronic device 1 may further include a third case 70. The third case 70 may be formed using a resin material such as polycarbonate (PC), or using any of other various materials. The battery 50 may be contained between the second case 60 and the third case 70. The third case 70 may include a packing 72. As a result of the space between the second case 60 and the third case 70 being sealed with the packing 72, water, dust, and the like are prevented from entering the inside of the electronic device 1. The internal structures such as the circuit board 40 and the battery 50 inside the electronic device 1 are thus protected from water, dust, and the like.

The electronic device 1 may further include a flexible board 46. The flexible board 46 may electrically connect the circuit board 40 and the display 30 to each other. The flexible board 46 may be located along the frame portion 12. This can reduce stress exerted on the flexible board 46.

The flexible board 46 may include a terminal portion 48 for electrically connecting to the circuit board 40. The terminal portion 48 may be elastic. The terminal portion 48 may be electrically connected to the circuit board 40 by being sandwiched between the first case 10 and the second case 60. In the case where the second case 60 is fastened by the fastening member 62 such as screws, the force of pressing the terminal portion 48 against the circuit board 40 can be easily controlled by the force of fastening the fastening member 62.

The electronic device 1 may further include an operating portion 19. The operating portion 19 may include a button-type switch. In FIG. 6, when a user of the electronic device 1 presses the operating portion 19, a signal based on the press is input to the flexible board 46, and then output to the circuit board 40. The electronic device 1 may receive operation by the user in this way.

Figure 7:
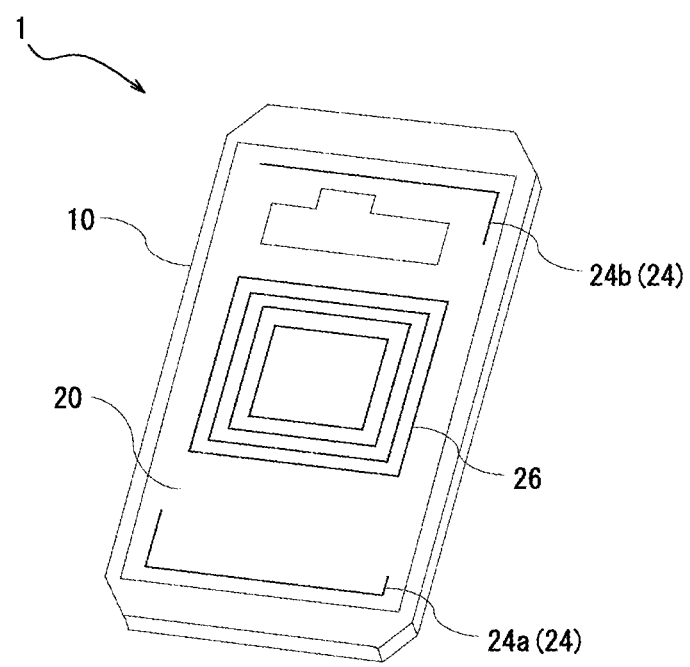
FIG. 7 is a perspective view illustrating an example of arrangement of an antenna.
Figure 7:
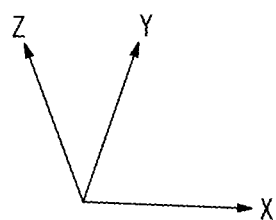

As illustrated in FIG. 7, the electronic device 1 may further include the communication antenna 24. The communication antenna 24 may, for example, transmit and receive communication radio waves of LTE (Long Term Evolution), 4G (4th Generation), 5G (5th Generation), or the like. For example, the communication antenna 24 may receive radio waves of GPS (Global Positioning System) and the like. The communication antenna 24 is electrically connected to the circuit board 40. In the case where the communication module is mounted on the circuit board 40, the communication antenna 24 may transmit and receive signals to and from the communication module.

The communication antenna 24 may include a first communication antenna 24a and a second communication antenna 24b. The first communication antenna 24a is also referred to as a main antenna. The second communication antenna 24b is also referred to as a sub-antenna. The frequency band of radio waves transmitted and received by the main antenna may be different from the frequency band of radio waves transmitted and received by the sub-antenna. The communication antenna 24 may be implemented in the form of a monopole antenna, or implemented in any other form.

The electronic device 1 may further include a short-range antenna 26. The short-range antenna 26 may receive radio waves of wireless charging, or transmit and receive radio waves of near field communication (NFC). Wireless charging may be implemented based on the Qi standard. The electronic device 1 may receive power supply radio waves by the short-range antenna 26, and charge the battery 50. The short-range antenna 26 may be implemented in the form of a planar coil, or implemented in any other form. The communication antenna 24 and the short-range antenna 26 are also simply referred to as an antenna.

The communication antenna 24 or the short-range antenna 26 may be mounted on the first surface 10a side where the display 30 is located. This can enhance the efficiency of transmission and reception of radio waves on the display 30 side. Moreover, the transmission and reception of radio waves by the antenna are less affected by noise that can be generated by the circuit board 40. The communication antenna 24 or the short-range antenna 26 may be mounted on the resin plate 20. Thus, the communication antenna 24 or the short-range antenna 26 can be mounted so as to be capable of transmitting and receiving radio waves in a large area. This enhances the convenience of the electronic device 1.

In the electronic device 9 according to the comparative example, the housing includes the metal plate 90. The metal plate 90 blocks radio waves. That is, in the case where the housing includes the metal plate 90, it is difficult to mount the communication antenna 24 or the short-range antenna 26 in a large area. Hence, the electronic device 1 according to this embodiment has higher convenience than the electronic device 9 according to the comparative example.

Figure 8:
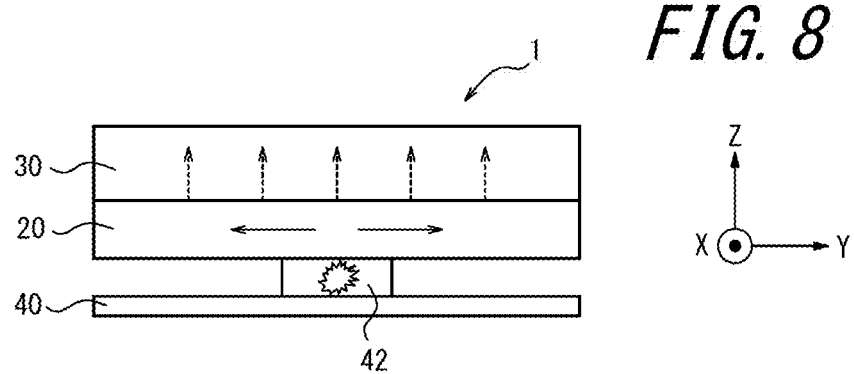
FIG. 8 is a diagram illustrating an example of diffusion of heat from a heat generator.

Electronic components such as the communication module and the processor are mounted on the circuit board 40, as mentioned above. These electronic components generate heat by operation of the electronic device 1. For example, the processor generates heat by computation. As illustrated in FIG. 8, a component such as the processor is regarded as a heat generator 42. Suppose heat of the heat generator 42 diffuses toward the resin plate 20. The resin plate 20 has a predetermined heat capacity. The heat diffused from the heat generator 42 to the resin plate 20 is once accumulated in the resin plate 20. That is, the resin plate 20 functions as a buffer of heat. When the heat is accumulated in the resin plate 20, the heat also diffuses in the in-plane direction indicated by solid arrows. The heat accumulated in the resin plate 20 diffuses in the thickness direction indicated by dashed arrows. Since the resin plate 20 accumulates the heat, the diffusion of the heat to the display 30 is reduced. As a result of the diffusion of the heat to the display 30 being reduced, the temperature of the surface of the display 30 is kept from becoming high.

Figure 9:
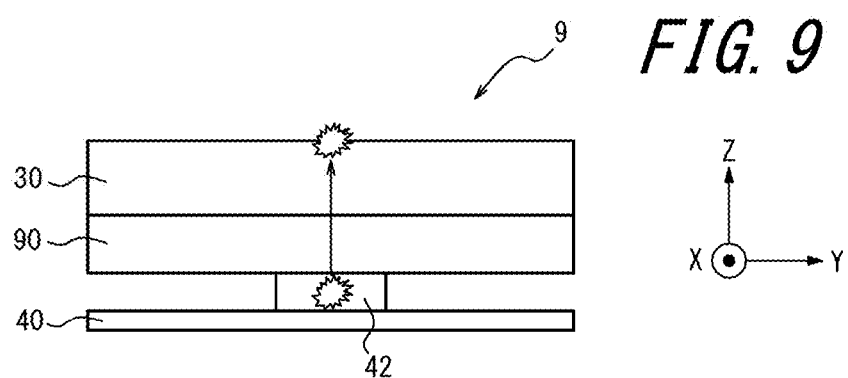
FIG. 9 is a diagram illustrating diffusion of heat in the comparative example.

As illustrated in FIG. 9, in the electronic device 9 according to the comparative example, the metal plate 90 is located between the circuit board 40 and the display 30. The metal plate 90 can have higher heat conductivity than the resin plate 20. In the case where the metal plate 90 has higher heat conductivity, the amount of heat accumulated in the metal plate 90 is less than the amount of heat accumulated in the resin plate 20. Accordingly, the metal plate 90 diffuses heat to the display 30 faster than the resin plate 20. That is, in the comparative example, heat from the heat generator 42 is likely to diffuse in the thickness direction indicated by a solid arrow, without diffusing in the in-plane direction much. In this case, the temperature of the surface of the display 30 tends to become high locally.

As compared with the electronic device 9 according to the comparative example, heat from the heat generator 42 in the electronic device 1 according to this embodiment is less likely to diffuse in the thickness direction. The temperature of the surface of the display 30 in the electronic device 1 according to this embodiment is therefore kept from becoming high. This reduces the risk that the user of the electronic device 1 feels hot or suffers a low-temperature burn when touching the surface of the display 30.

Figure 10:
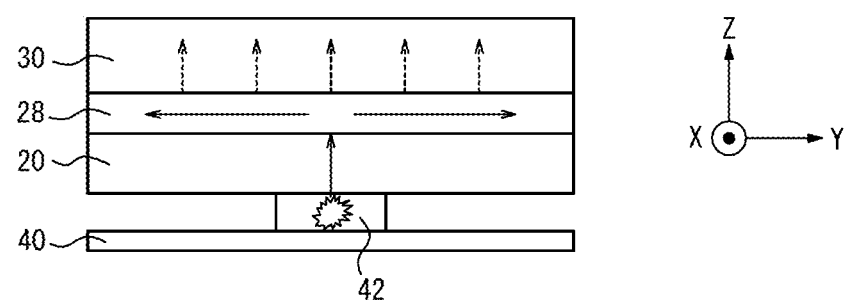
FIG. 10 is a diagram illustrating an example of diffusion of heat in the case of including a heat transfer sheet.

As illustrated in FIG. 10, the electronic device 1 may further include a heat transfer sheet 28 between the resin plate 20 and the display 30. The heat transfer sheet 28 has higher heat conductivity than the resin plate 20. The heat transfer sheet 28 may be formed by, for example, a graphite sheet. The heat transfer sheet 28 is not limited to such, and may be made of any of various materials having high heat conductivity. With the inclusion of the heat transfer sheet 28, heat diffuses from the heat generator 42 toward the heat transfer sheet 28 through the resin plate 20 in the thickness direction, and then diffuses in the in-plane direction in the heat transfer sheet 28, as indicated by solid arrows. The heat diffused in the in-plane direction in the heat transfer sheet 28 further diffuses in the thickness direction toward the display 30, as indicated by dashed arrows. Since the heat diffuses in the in-plane direction in the heat transfer sheet 28 before diffusing to the display 30, the temperature of the surface of the display 30 is kept from becoming high locally. In the case where the electronic device 1 includes the heat transfer sheet 28, the risk that the user of the electronic device 1 feels hot or suffers a low-temperature burn when touching the surface of the display 30 can be further reduced as compared with the case where the electronic device 1 does not include the heat transfer sheet 28.

The heat transfer sheet 28 may be located between the resin plate 20 and the circuit board 40. In this case, too, the temperature of the display 30 is kept from becoming high locally.

While some embodiments of the present disclosure have been described above by way of drawings and examples, various changes or modifications may be easily made by those of ordinary skill in the art based on the present disclosure. Such various changes or modifications are therefore included in the scope of the present disclosure. For example, the functions included in the functional units, etc. may be rearranged without logical inconsistency, and a plurality of functional units, etc. may be combined into one functional unit, etc. and a functional unit, etc. may be divided into a plurality of functional units, etc. Moreover, each of the disclosed embodiments is not limited to the strict implementation of the embodiment, and features may be combined or partially omitted as appropriate.

The drawings illustrating the structures according to the present disclosure are schematic, and the dimensional ratios and the like in the drawings do not necessarily correspond to the actual dimensional ratios and the like.

Terms such as "first" and "second" in the present disclosure are identifiers for distinguishing components. Components distinguished by terms such as "first" and "second" in the present disclosure may have their numbers interchanged with each other. For example, the identifier "first" of the "first surface" and the identifier "second" of the "second surface" may be interchanged with each other. The identifiers are replaced with each other simultaneously. The components are distinguishable even after their identifiers are interchanged. The identifiers may be omitted. Components from which identifiers are omitted are distinguished by reference signs. Description of identifiers such as "first" and "second" in the present disclosure alone should not be used for interpretation of order of components or reasoning based on one identifier being smaller than another identifier.

The X-axis, the Y-axis, and the Z-axis in the present disclosure are provided for the purpose of illustration, and may be replaced with one another. Components in the present disclosure have been described using an orthogonal coordinate system formed by the X-axis, the Y-axis, and the Z-axis, but the positional relationships among components according to the present disclosure are not limited to orthogonal relationships.

The invention claimed is:

1. An electronic device comprising:
    a first case comprising a first surface and a second surface located on an opposite side from the first surface;
    a resin plate located inside the first case; and
    a display located on a side facing the first surface,
    wherein the first case further comprises
    a frame portion comprising two opposing long sides and two opposing short sides,
    a support portion projecting inward from the frame portion to support the resin plate and comprising side surfaces located at projection ends that define an opening, and
    a bridging portion connecting the long sides and dividing the opening into at least two openings.

2. The electronic device according to claim 1, wherein the first case is separate from the resin plate.

3. The electronic device according to claim 1, wherein the resin plate is at least partially attached to the first surface.

4. The electronic device according to claim 1, further comprising a heat generator located on a side facing the second surface inside the first case.

5. The electronic device according to claim 4, wherein the resin plate is located between the heat generator and the display.

6. The electronic device according to claim 1, further comprising an antenna mounted on the resin plate.

7. The electronic device according to claim 1, wherein at least one of the at least two openings is shorter in a direction along the long sides than in a direction along the short sides.

8. The electronic device according to claim 1, wherein the bridging portion is thinner than the frame portion.

9. The electronic device according to claim 1, further comprising a second case located on a side facing the second surface and fixed to the first case.

10. The electronic device according to claim 9, further comprising a terminal portion located between the first case and the second case.

11. The electronic device according to claim 10, wherein the terminal portion is at least partially sandwiched between the second surface and the second case.

12. The electronic device according to claim 11, wherein the terminal portion comprises a spring terminal.

* * * * *